United States Patent [19]
Tseng

[11] 4,250,517
[45] Feb. 10, 1981

[54] CHARGE TRANSFER, TETRODE BUCKET-BRIGADE DEVICE

[75] Inventor: Hsin-fu Tseng, Cupertino, Calif.

[73] Assignee: Reticon Corporation, Sunnyvale, Calif.

[21] Appl. No.: 98,783

[22] Filed: Nov. 30, 1979

[51] Int. Cl.³ .............. H01L 29/78; H01L 29/04; G11C 19/28
[52] U.S. Cl. ................. 357/24; 307/221 D; 357/59
[58] Field of Search ............ 357/24; 307/221 D

[56] References Cited
U.S. PATENT DOCUMENTS

| | | | |
|---|---|---|---|
| 3,735,156 | 5/1973 | Krambeck et al. | 357/24 |
| 3,745,383 | 7/1973 | Sangster | 357/24 |
| 4,157,558 | 6/1979 | Weckler | 357/24 |

OTHER PUBLICATIONS

Sequin et al., *Charge Transfer Devices*, Academic Press, N.Y. (1975), pp. 38-39.

*Primary Examiner*—Gene M. Munson
*Attorney, Agent, or Firm*—Blakely, Sokoloff, Taylor & Zafman

[57] ABSTRACT

An improved BBD structure is disclosed which is realized with MOS, two layer, polysilicon technology. In the tetrode structure, the transfer gate overlaps the tetrode gate with no intermediate substrate region. The storage capacitor is off-set from the propagation channel and is formed by the two layers of polysilicon without using a p-n junction. High transfer efficiency is obtained over a wide frequency range with a shorter length per stage.

8 Claims, 3 Drawing Figures

CHARGE TRANSFER, TETRODE BUCKET-BRIGADE DEVICE

BACKGROUND OF THE INVENTION

1. Field of the Invention

The invention relates to the field of charge transfer devices, particularly bucket-brigade devices.

2. Prior Art

The bucket-brigade device (BBD), despite certain advantages over the charge-coupled device (CCD) has received much less attention than the CCD. The most important advantage of the BBD is the simplicity and flexibility of tapping the signals along the device. This ability is particularly important for correlators and transversal filters, as well as for interfacing with peripheral circuitry. Another advantage of the BBD is its compatability with existing MOS processing. As a result, a wealth of circuits used in making memories and microprocessors can be integrated on the same substrate with the BBD. The development of modern MOS technology, along with the tetrode gate BBD structure which reduces the effects of channel-length and barrier-height modulations, make the performance of the BBD very comparable with its CCD counterpart in the low frequency range.

As will be seen, the present invention provides a BBD with more efficient charge transfer, which improves the low frequency and high frequency performance of the device. The specific prior art aspects of the BBD which are affected by the invented structure, are described in conjunction with FIG. 1 and with reference to the closest prior art device known to applicant, that shown in U.S. Pat. No. 4,157,558.

SUMMARY OF THE INVENTION

A metal-oxide-semiconductor (MOS) bucket-brigade, charge transfer device fabricated on a substrate which includes a plurality of stages is described. Each stage has a first gate (tetrode gate) and a second gate (transfer gate), each gate having first and second opposite sides. The first side of the second gate overlaps the second side of the first gate. A doped region in the substrate, spaced-apart from the second side of the first gate, extends from the second side of the second gate to the first side of the first gate of the next succeeding stage. A capacitor is disposed between this region and the second gate.

In the presently preferred embodiment, the first gate is fabricated from a first layer of polysilicon and the second gate from a second layer of polysilicon. The capacitor is spaced-apart from the propagation channel and is formed from the first and second layers of polysilicon.

DETAILED DESCRIPTION OF THE INVENTION

A metal-oxide-semiconductor (MOS) charge transfer device, namely a bucket-brigade device (BBD), is described. In the following description, numerous well-known processing steps, theories of operation, etc., relating to BBDs are not set forth in detail in order not to obscure the present invention in unnnecessary detail. In other instances, specific details such as conductivity types are set forth to provide a complete explanation of the present invention. However, it will be obvious to one skilled in the art that these details are not required to practice the invention.

The presently described BBD is an improvement over the BBD shown in U.S. Pat. No. 4,157,558. Many of the processing steps used to fabricate this prior art device, particularly those relating to the double polycrystalline silicon (polysilicon) technology are applicable to the fabrication of the present invention.

In BBDs, the mechanisms which influence the transfer inefficiencies can be classified according to the operating frequencies of the device. The intrinsic transfer rate dominates at high frequencies, while the channel-length and barrier-height modulations prevail at low frequencies.

Figure 1:
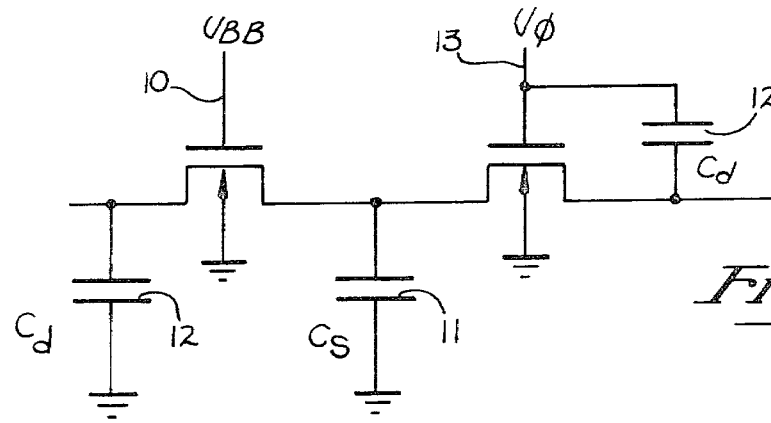
FIG. 1 is a field-effect transistor (FET) model of a tetrode bucket-brigade device used to discuss charge transfer efficiency.

Referring to the FET model of FIG. 1, the tetrode BBD includes a tetrode gate 10 and the transfer gate 13. $C_s$ represents the junction and overlap capacitance associated with the substrate region disposed between the tetrode gate and the transfer gate. $C_d$ represents the storage capacitance. Referring for a moment to the prior art BBD shown in FIG. 4 of U.S. Pat. No. 4,157,558, $C_s$ is the junction and overlap capacitance associated with region 108 while $C_d$ is the capacitance associated with member 115 and the underlying substrate region (storage capacitance) 109.

The low frequency transfer efficiency of a tetrode BBD can be improved by reducing the ratio $C_s/C_d$. This usually can only be achieved by increasing $C_d$, since there is a limitation on the minimum obtainable $C_s$. However, a larger $C_d$ results in a degradation to high frequency performance since there is a decrease in the intrinsic transfer rate.

With the present invention, by using first and second layers of polysilicon the transfer gate is made to overlap the tetrode gate. The capacitance $C_s$ is completely eliminated since the junction normally disposed between these gates is non-existent.

Another advantage provided by the present invention is that the storage capacitance ($C_d$) is formed by the two layers of polysilicon rather than between one layer of polysilicon and the substrate. This greatly reduces the dark current by omitting the p-n junction associated with the MOS capacitor. Referring again to U.S. Pat. No. 4,157,558, the dark current associated with regions 109 and 112, is no longer present.

Thus, in general, the present invention provides high transfer efficiencies over a wide frequency range due to the elimination of $C_s$. Moreover, shorter lengths per stage are obtained by omitting one of the doped regions in each stage.

Figure 2:
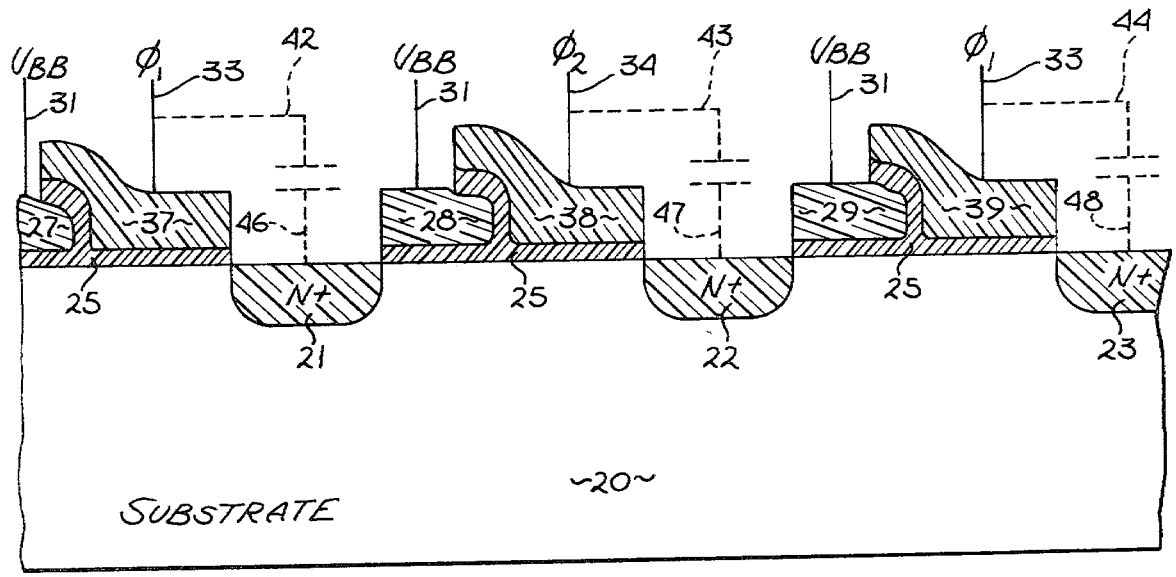
FIG. 2 is a cross-sectional elevation view of a bucket-brigade device built in accordance with the present invention.

Referring now to FIG. 2, three stages of the BBD are shown fabricated on a p-type silicon substrate 20. Each stage of the BBD includes a transfer gate such as gates 37, 38, and 39 and a tetrode gate such as gates 27, 28, and 29. Each stage also includes an n-type region (regions 21, 22 and 23) and a storage capacitor coupling the transfer gate with its respective doped region. These capacitors are shown in dotted lines in FIG. 2 since in this cross-sectional elevation view (which is taken through the propagation channel) they would not otherwise appear.

Figure 3:
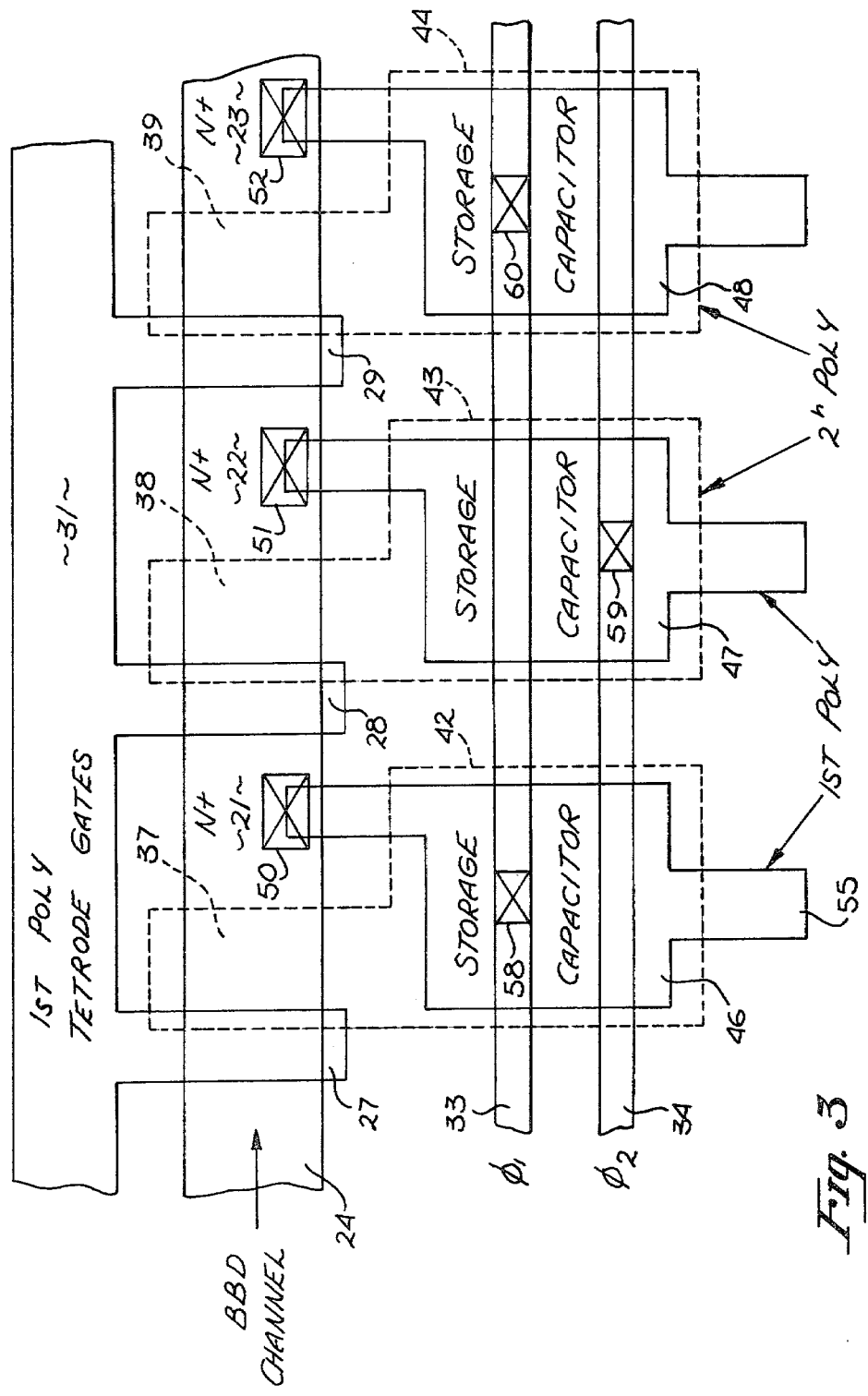
FIG. 3 is a plan view of the device of FIG. 2.

In FIG. 3, the propagation channel 24 along which charge is transferred, is clearly seen. Line 31 is formed on one side of this channel, this line includes a plurality of fingers or gates, which extend over the channel. These are the tetrode gates 27, 28 and 29. Since these gates are common with line 31, the $V_{BB}$ potential applied to this line, is coupled over the propagation channel. The transfer gates 37, 38, and 39 of FIG. 2 are also illustrated in FIG. 3 and each extends over the propagation channel from the opposite side of this channel. As is clearly seen, these gates overlap one side of their respective tetrode gate.

Each of the gates 37, 38 and 39 includes, spaced-apart from the channel, a generally rectangular, integral, member which defines one plate of a capacitor ($C_d$). Gate 37 includes the general rectangular member 42, while gate 38 includes member 43, and gate 39 member 44. The other plate of the capacitor consists of a member which is insulated from, and disposed below, members 42, 43, and 44. For example, the member 46 is disposed below member 42. This member includes a finger extending over the channel which is in contact through a contact 50 with the n-type region 21. The member 46 may also include an oppositely disposed finger 55 which, for example, may be the gate of a field-effect transistor. This allows easy sensing of the charge in the region 21. (Note that other contact means, to sense charge in the BBD, may be employed such as using additional contacts to contact either the region 21 or the member 46.) Similarly, the next stage of the device includes a member 47 which contacts the n-type region 22 via the contact 51. Also the member 48 contacts the n-type region 23 through the contact 52.

The timing or clocking signals used to transfer charge along the channel is coupled to the transfer gates 37, 38, and 39. For the two phase system illustrated, the $\phi_1$ signal is applied to a line 33 and the $\phi_2$ signal to the line 34. Line 33 is connected through contact 58 to member 42 and gate 37. The next stage of the device receives the $\phi_1$ signal through contact 60.

In the presently preferred embodiment, well-known two layer polysilicon technology is employed to fabricate the device. Starting with a p-type substrate 20, an oxide layer 25, which may be for example 500 A thick, is formed over the substrate. ("Front-end" steps often used to form field-oxides and doping steps for doping regions of the substrate to desired concentration levels are not described). After the formation of the oxide layer 25, a first layer of polysilicon is disposed over the substrate. This layer, through ordinary masking and etching steps, is used to define the gates 27, 28 and 29, and the integral line 31. Also with the same masking and etching steps the lower members of the storage capacitors (members 46, 47 and 48), including their extensions into the channel region, are formed.

Next, an oxide layer is formed over the first layer of polysilicon and then a second layer of polysilicon is deposited. Employing ordinary masking and etching steps, the transfer gates with their integral (upper) members for the storage capacitors are formed from this layer. Note that with this masking and etching the overlapping of the tetrode gates by the transfer gates is obtained. Now, through a doping step, which may employ ordinary diffusion or ion implantation, the regions 21, 22 and 23 are formed in the substrate. An arsenic or phosphorous dopant may be employed. These regions are formed in alignment with one side of the transfer gates and one side of the tetrode gates of the next step.

Now, the contacts, such as contacts 50, 51, 52 58, 59 and 60 are formed. Ordinary metal contacts may be employed or in the case of contacts 50, 51 and 52, buried contacts may be used..(As is well-known, other processing steps are required to form the buried contacts). A layer of aluminum or other metal may now be formed over the substrate and used to define the lines 33 and 34. These lines, as mentioned, are in contact with the appropriate transfer gates.

As will be apparent to one skilled in the art, simultaneously with the fabrication of the BBD, numerous peripheral circuits or other circuits, such as those used in a transversal filter may be fabricated.

The BBD of FIGS. 2 and 3 operates in a well-known manner to transfer charge along the channel 24, except that charge is transferred directly to the transfer gate from the tetrode gate because the prior art intermediate region is not employed. A fixed potential $V_{BB}$ is applied to the tetrode gates while the timing signals $\phi_1$ and $\phi_2$ are applied to lines 33 and 34, thereby transferring charge along the channel.

Thus a bucket-brigade device has been described which provides high transfer efficiency over a wide frequency range. The capacitance $C_s$ is eliminated by omitting the junction normally found between the transfer gate and tetrode gate. Instead, the transfer gate overlaps the tetrode gate, permitting the charge transfer. The device has a shorter length per stage because of the omission of this region. The dark current is substantially reduced since a p-n junction is not employed for the storage capacitor, but rather a capacitor offset from the channel and formed by two layers of polysilicon and the intermediate oxide layer is used.

I claim:

1. An MOS bucket-brigade, charge transfer, device fabricated on a semiconductor substrate comprising a channel of propagation, and a plurality of stages each of which includes:

a first gate having first and second opposite sides;

a second gate having first and second opposite sides, said first side of said second gate overlapping said second side of said first gate;

a doped region in said substrate spaced-apart from said second side of said first gate and extending between said second side of said second gate and said first side of said first gate of the next succeeding one of said stages; and said first gate being formed from a layer of conductive material;

a capacitor disposed between said region and said second gate, said capacitor comprising an extension of said second gate disposed apart from the channel of propagation in said device and an underlying member formed from said layer of conductive material, said underlying member being in contact with said regions;

whereby high charge transfer efficiency in said bucket-brigade device is realized.

2. The device of claim 1 wherein said first gate is formed from a first layer of polysilicon and said second gate is formed from a second layer of polysilicon.

3. The device of claim 2 wherein said first gates of said stages are coupled to receive a fixed potential and said second gates are coupled to receive clocking signals.

4. The device defined by claim 3 wherein said doped regions are n-type regions.

5. A bucket-brigade, charge transfer, device disposed on a silicon substrate having a path of propagation, and a plurality of stages each of which comprises:
  a first gate insulated from said substrate, said first gate having a first and second side crossing the path of propagation in said device;
  a second gate having a first and second side which cross said path of propagation, said first side of said second gate overlapping said second side of said first gate, said second side of said second gate crossing said path of propagation beyond said second side of said first gate, said second gate being insulated from said first gate and said substrate;
  a doped region in said substrate extending along said path of propagation from said second side of said second gate to said first side of said first gate of the next one of said stages; and,
  a capacitor disposed between said region and said second gate, said capacitor comprising a portion of said second gate which extends beyond said path of propagation and a polysilicon member, insulated from said portion of said second gate, said member being in contact with said region;
  whereby a highly efficient charge transfer device is realized.

6. The device of claim 5 wherein said first gate is formed from a first layer of polysilicon and said second gate is formed from a second layer of polysilicon.

7. The device of claim 6 wherein said member is formed from said first layer of polysilicon.

8. The device defined by claim 7 wherein said first gates of said stages are coupled to receive a fixed potential and said second gates are coupled to receive timing signals.

* * * * *